(12) United States Patent
Senga et al.

(10) Patent No.: US 9,883,597 B2
(45) Date of Patent: *Jan. 30, 2018

(54) SOLDER SUPPLY DEVICE INCLUDING A NOZZLE WITH A PISTON AND A DEMARCATING MEMBER THAT DEMARCATES AN AIR CHAMBER IN WHICH AIR IS SUPPLIED TO MOVE THE PISTON RELATIVE TO A SOLDER CONTAINER

(71) Applicant: FUJI MACHINE MFG. CO., LTD., Chiryu (JP)

(72) Inventors: Akihiro Senga, Okazaki (JP); Shoji Fukakusa, Yokkaichi (JP); Ritsuo Hirukawa, Nishio (JP); Yoji Fujita, Okazaki (JP); Yoshimune Yokoi, Kiyosu (JP)

(73) Assignee: FUJI MACHINE MFG. CO., LTD., Chiryu (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/100,499

(22) PCT Filed: Dec. 5, 2013

(86) PCT No.: PCT/JP2013/082709
§ 371 (c)(1),
(2) Date: May 31, 2016

(87) PCT Pub. No.: WO2015/083271
PCT Pub. Date: Jun. 11, 2015

(65) Prior Publication Data
US 2016/0338209 A1    Nov. 17, 2016

(51) Int. Cl.
*B23K 3/06*    (2006.01)
*H05K 3/34*    (2006.01)
(Continued)

(52) U.S. Cl.
CPC ........ *H05K 3/3468* (2013.01); *B05C 11/1002* (2013.01); *B05C 17/00533* (2013.01);
(Continued)

(58) Field of Classification Search
CPC ..... B23K 3/06; H05K 3/3468; B05C 11/1002
See application file for complete search history.

(56) References Cited

U.S. PATENT DOCUMENTS 4,189,065 A * 2/1980 Herold ................. G01F 11/027
222/390
4,527,717 A * 7/1985 Emoto ................... B22D 37/00
222/146.5
(Continued)

FOREIGN PATENT DOCUMENTS

JP    60-1573 U    1/1985
JP    2003-311930 A    11/2003
(Continued)

OTHER PUBLICATIONS

International Search Report dated Feb. 18, 2014 in PCT/JP2013/082709 filed on Dec. 5, 2013.
(Continued)

*Primary Examiner* — Karl Kurple
(74) *Attorney, Agent, or Firm* — Oblon, McClelland, Maier & Neustadt, L.L.P.

(57) ABSTRACT

A solder supply device provided with a solder cup housing liquid solder that is tubular and open at one end; a nozzle section, for ejecting solder from the solder container, that is inserted into the solder container; a flange section that is provided on an outer circumferential section of the nozzle section and that is engaged inside of the solder cup; and an outer tube that demarcates an air chamber with the bottom surface of the solder cup. Solder is supplied from the tip of the nozzle section by the solder cup and the flange section
(Continued)

being relatively moved by supplying air to the air chamber. Solder is supplied from the solder container without using an air cylinder, electromagnetic motor, or the like.

9 Claims, 12 Drawing Sheets

(51) Int. Cl.
| | |
|---|---|
| *B05C 11/10* | (2006.01) |
| *B05C 17/005* | (2006.01) |
| *B41F 15/42* | (2006.01) |
| *B41F 15/40* | (2006.01) |
| *H05K 3/12* | (2006.01) |
| *B23K 101/42* | (2006.01) |

(52) U.S. Cl.
CPC .............. *B23K 3/06* (2013.01); *B23K 3/0638* (2013.01); *B41F 15/40* (2013.01); *B41F 15/405* (2013.01); *B41F 15/42* (2013.01); *B41F 15/423* (2013.01); *H05K 3/1233* (2013.01); *B23K 2201/42* (2013.01)

(56) References Cited

U.S. PATENT DOCUMENTS

| | | | | | |
|---|---|---|---|---|---|
| 4,622,239 | A | * | 11/1986 | Schoenthaler | B23K 3/06 118/406 |
| 4,720,402 | A | * | 1/1988 | Wojcik | B23K 3/0638 228/179.1 |
| 5,647,510 | A | * | 7/1997 | Keller | B05C 17/00513 222/105 |
| 5,992,695 | A | * | 11/1999 | Start | G01F 11/021 222/137 |
| 6,308,868 | B1 | * | 10/2001 | Hoffman | B05C 17/00576 222/153.01 |
| 6,736,291 | B1 | * | 5/2004 | Mimura | B05C 11/00 222/129 |
| 9,162,249 | B2 | * | 10/2015 | Koyama | B05C 5/0225 |
| 9,278,401 | B2 | * | 3/2016 | Biggs | B23K 3/0607 |
| 2001/0010324 | A1 | * | 8/2001 | Maeda | B23K 3/0623 228/256 |
| 2002/0038814 | A1 | * | 4/2002 | Mimura | B23K 3/0607 228/256 |
| 2013/0087057 | A1 | * | 4/2013 | Kondo | H05K 3/1233 101/123 |
| 2016/0297021 | A1 | * | 10/2016 | Senga | B23K 3/06 |
| 2016/0303675 | A1 | * | 10/2016 | Fujita | H05K 3/3484 |

FOREIGN PATENT DOCUMENTS

| | | |
|---|---|---|
| JP | 2004-306102 A | 11/2004 |
| JP | 2005-96126 A | 4/2005 |

OTHER PUBLICATIONS

Extended European Search Report dated Jul. 28, 2017 in European Patent Application No. 13 898 551.0.

Chinese Office Action dated Oct. 11, 2017 in Chinese Application No. 201380081378.2 (with translation). 12 pages.

* cited by examiner

SOLDER SUPPLY DEVICE INCLUDING A NOZZLE WITH A PISTON AND A DEMARCATING MEMBER THAT DEMARCATES AN AIR CHAMBER IN WHICH AIR IS SUPPLIED TO MOVE THE PISTON RELATIVE TO A SOLDER CONTAINER

TECHNICAL FIELD

The present disclosure relates to a solder supply device for supplying liquid solder from a solder container housing liquid solder, the solder container being tubular and open at one end.

BACKGROUND ART

As disclosed in patent literature 1 listed below, there are solder supply devices that supply liquid solder from a solder container by increasing the pressure inside the solder container using an air cylinder. Also, as disclosed in patent literature 2, there are devices that supply liquid solder from a solder container by operating a mechanism that increases the pressure inside the solder container using an electromagnetic motor.
Patent literature 1: JP-A-2003-311930
Patent literature 2: JP-A-2004-306102

SUMMARY

According to the solder supply devices disclosed in the above patent literature, it is possible to supply liquid solder from a solder container. However, in the solder supply devices disclosed in the above patent literature, an air cylinder, electromagnetic motor, or the like, must be provided, making the construction of the solder supply device complex. Also, space is required for the air cylinder, electromagnetic motor, or the like, making the solder supply device larger. The present disclosure takes account of such problems and an object thereof is to provide a solder supply device that supplies liquid solder from a solder container without using an air cylinder, electromagnetic motor, or the like.

To solve the above problems, the solder supply device according to one embodiment of the disclosure comprises: a solder container housing liquid solder that is tubular and open at one end; a nozzle, for ejecting solder from the solder container, that is inserted into the solder container; a piston that is provided on an outer circumferential section of the nozzle and that is engaged inside of the solder container from the opening of the solder container; and a demarcating member that demarcates an air chamber with at least one out of a surface of the other end of the solder container, an adapter attached to the surface of the other end, and a surface of the piston facing the opening of the solder container, wherein the solder supply device supplies solder from the tip of the nozzle by relatively moving the solder container and the piston by the supplying of air to the air chamber.

Further, the solder supply device according to another embodiment of the disclosure, wherein the piston is provided on the outer circumferential section of the nozzle relatively movable to the nozzle, the solder supply device is further provided with a lid that seals the opening of the solder container in a state with the tip of the nozzle inserted into the solder container, and wherein the lid functions as the demarcating member.

Further, the solder supply device according to another embodiment of the disclosure, wherein the piston is fixedly provided on the outer circumferential section of the nozzle, the solder supply device is further provided with an outer tube that is tubular with an opening at one end and that stores the solder container in a state with the other end of the solder container engaged from the opening, and wherein the outer tube functions as the demarcating member.

Further, the solder supply device according to another embodiment of the disclosure, wherein the solder supply device is further provided with an inner tube that is tubular with an opening at both ends, holds the piston or the nozzle at one end, extends from the opening of the solder container at the other end, and is fixed to the outer tube.

Further, the solder supply device according to another embodiment of the disclosure, wherein the inner tube is separable from the piston or the nozzle.

Further, the solder supply device according to another embodiment of the disclosure, wherein the surface of the other end of the outer tube is operable/closable.

Further, the solder supply device according to another embodiment of the disclosure, wherein the outer tube is swingably attached to a solder printer that prints solder on a target object.

Further, the solder supply device according to another embodiment of the disclosure, wherein the friction arising between the outer circumferential section of the piston and the inner circumferential surface of the solder container is greater than the holding force of the piston or the nozzle by the inner tube.

Further, the solder supply device according to another embodiment of the disclosure, wherein the solder supply device is detachably mounted on a solder printer that prints solder on a target object by a lock mechanism.

ADVANTAGEOUS EFFECTS

In the solder supply device according to one embodiment of the disclosure, the nozzle for ejecting solder in the solder container to the outside of the device is inserted into the solder container. A piston is provided on an outer circumferential section of the nozzle and that piston is engaged inside the solder container from the opening of the solder container. Also, a demarcating member is provided on the solder supply device, such that an air chamber is demarcated by the demarcating member and one out of the surface of the other end of the solder container, an adapter attached to the surface of the other end, and a surface of the piston facing the opening of the solder container. Also, solder is supplied from the tip of the nozzle by relatively moving the solder container and the piston by air being supplied to the air chamber. In other words, the bottom surface of the solder container or an adapter attached to the bottom surface of the solder container is directly pressed by the air, thus moving the solder container towards the piston. By this, the pressure inside the solder container increases and solder is supplied from the solder container. Also, the piston moves towards the bottom surface of the solder container by the piston engaged inside the solder container being pressed directly by air. By this, the pressure inside the solder container increases and solder is supplied from the solder container. Thus, according to the solder supply device disclosed in claim 1, solder can be supplied from a solder container without requiring an air cylinder, electromagnetic motor, or the like.

Also, with the solder supply device according to another embodiment of the disclosure, the piston is relatively movable to the nozzle. Further, a lid that seals the opening of the solder container in a state with the tip of the nozzle inserted functions as a demarcating member. By this, the air chamber is demarcated by the piston and the lid, and the piston is moved appropriately by the air pressure.

Also, with the solder supply device according to another embodiment of the disclosure, the piston is fixedly provided on the outer circumferential section of the nozzle. Further, an outer tube that is tubular with an opening at one end and that stores the solder container in a state with the other end of the solder container engaged from the opening functions as a demarcating member. By this, the air chamber is demarcated by the bottom surface of the solder container and the outer tube, or the outer tube and the adapter attached to the bottom surface of the solder, and the solder container is moved appropriately by the air pressure.

Also, with the solder supply device according to another embodiment of the disclosure, an inner tube that is tubular with an opening at both ends is provided. This inner tube holds the piston or the nozzle at one end, extends from the opening of the solder container at the other end, and is fixed to the outer tube. By this the piston or the nozzle is fixedly held, and the solder container is able to be moved appropriately towards the piston.

Also, with the solder supply device according to another embodiment of the disclosure, the inner tube is separable from the piston or nozzle. That is, the piston or the nozzle, which directly contact solder, are able to be removed from the inner tube. This means that it is easy to wash the piston and nozzle, which easily become dirty, individually.

Also, with the solder supply device according to another embodiment of the disclosure, the surface opposite to the opening of the outer tube is openable/closable. By this, for example, by opening that surface, the solder container and so on is able to be removed from the opened location, which facilitates the performance of exchange work and so on of the solder container.

Also, with the solder supply device according to another embodiment of the disclosure, the outer tube is swingably attached to a solder printer. That is, the solder supply device provided at a specified location on a solder printer is able to be inclined. By this, for example, by opening the surface of the outer tube opposite to the opening, and making the opened location face down, the solder container in the outer tube is ejected from the outer tube by gravity. Thus, according to the solder supply device disclosed in claim 7, it is easy to remove the solder container from the outer tube.

Also, with the solder supply device according to another embodiment of the disclosure, the friction arising between the outer circumferential section of the piston and the inner circumferential surface of the solder container is greater than the holding force of the piston or the nozzle by the inner tube. Thus, when the solder container in the outer tube is ejected from the outer tube by gravity by opening the surface of the outer tube opposite to the opening, and making the opened location face down, the nozzle and the piston inside the solder container are removed from the outer tube along with the solder container. This facilitates the efficient performing of exchange work and so on of the solder container.

Also, the solder supply device according to another embodiment of the disclosure is detachably mounted on a solder printer by a lock mechanism. Thus, the solder supply device is able to be removed from the solder printer simply by releasing the lock mechanism, facilitating the performing of exchange work and so on of the solder container outside the printer. This curtails the inside of the printer becoming dirty due to fallen solder and so on during solder container exchange and the like. Also, the exchange work is performed outside the solder printer, not in the narrow space inside the solder printer, thus making exchange work easy to perform.

DESCRIPTION OF EMBODIMENTS

The following describes in detail referring to the figures example embodiments.

First Embodiment

<Configuration of Solder Printer>

Figure 1:
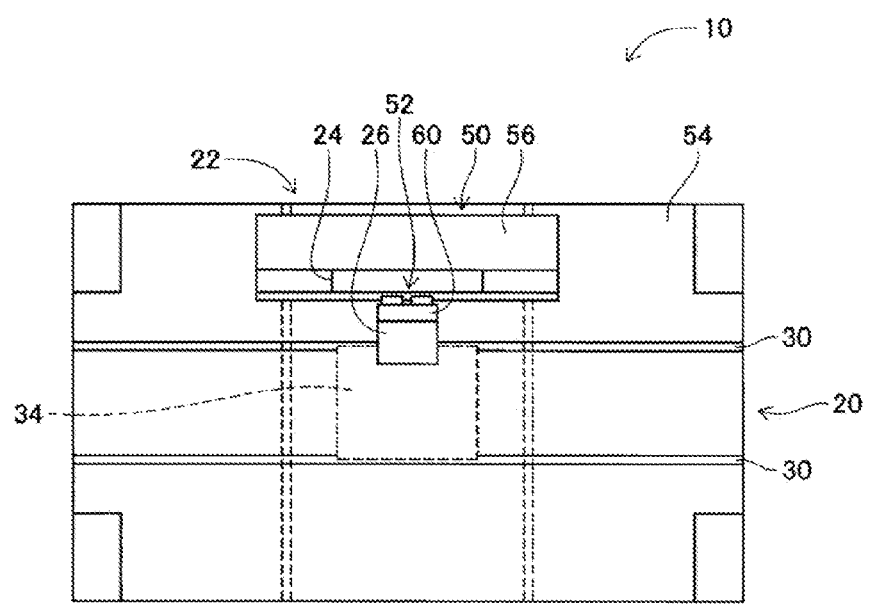
FIG. 1 is a plan view showing a solder printer of an embodiment.
Figure 1:
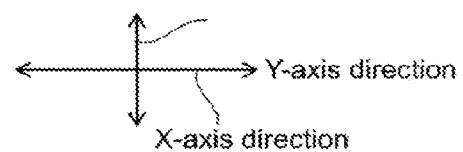

FIG. 1 shows solder printer 10 as an embodiment of the present disclosure. Solder printer 10 is a device that prints solder paste onto a circuit board. Solder printer 10 is provided with conveyance device 20, moving device 22, squeegee device 24, and solder supply device 26.

Conveyance device 20 has a pair of conveyor belts 30 that extend in the X-axis direction, and electromagnetic motor (refer to FIG. 4) 32 that rotates conveyor belts 30. The pair of conveyor belts 30 support circuit board 34 and circuit board 34 is conveyed in the X-axis direction by the driving of electromagnetic motor 32. Also, conveyance device 20 has holding device (refer to FIG. 4) 36. Holding device 36 fixedly holds circuit board 34 supported by conveyor belts 30 in a predetermined position (the position at which circuit board 34 is shown in FIG. 1). Note that a metal mask (not shown) is loaded on the upper surface of circuit board 34.

Moving device 22 is configured from Y-axis direction slide mechanism 50 and X-axis direction slide mechanism 52. Y-axis direction slide mechanism 50 has Y-axis slider 56 provided on base 54 so as to be movable in the Y-axis direction. Y-axis slider 56 is moved to any position in the Y-axis direction by the driving of electromagnetic motor (refer to FIG. 4) 58. Also, X-axis direction slide mechanism 52 has X-axis slider 60 provided on a side surface of Y-axis slider 56 to be movable in the X-axis direction. X-axis slider 60 is moved to any position in the X-axis direction by the driving of electromagnetic motor (refer to FIG. 4) 62.

Squeegee device 24 is attached to Y-axis slider 56 above conveyance device 20, and moves to any position above circuit board 34 that is held by conveyance device 20. Squeegee device 24 has a squeegee (not shown) and the squeegee is held extending downwards by squeegee device 24 to be movable in the Y-axis direction and the up/down directions. Further, the squeegee is moved in the Y-axis direction by the driving of electromagnetic motor (refer to FIG. 4) 66, and is moved up/down by the driving of electromagnetic motor (refer to FIG. 4) 68.

Figure 2:
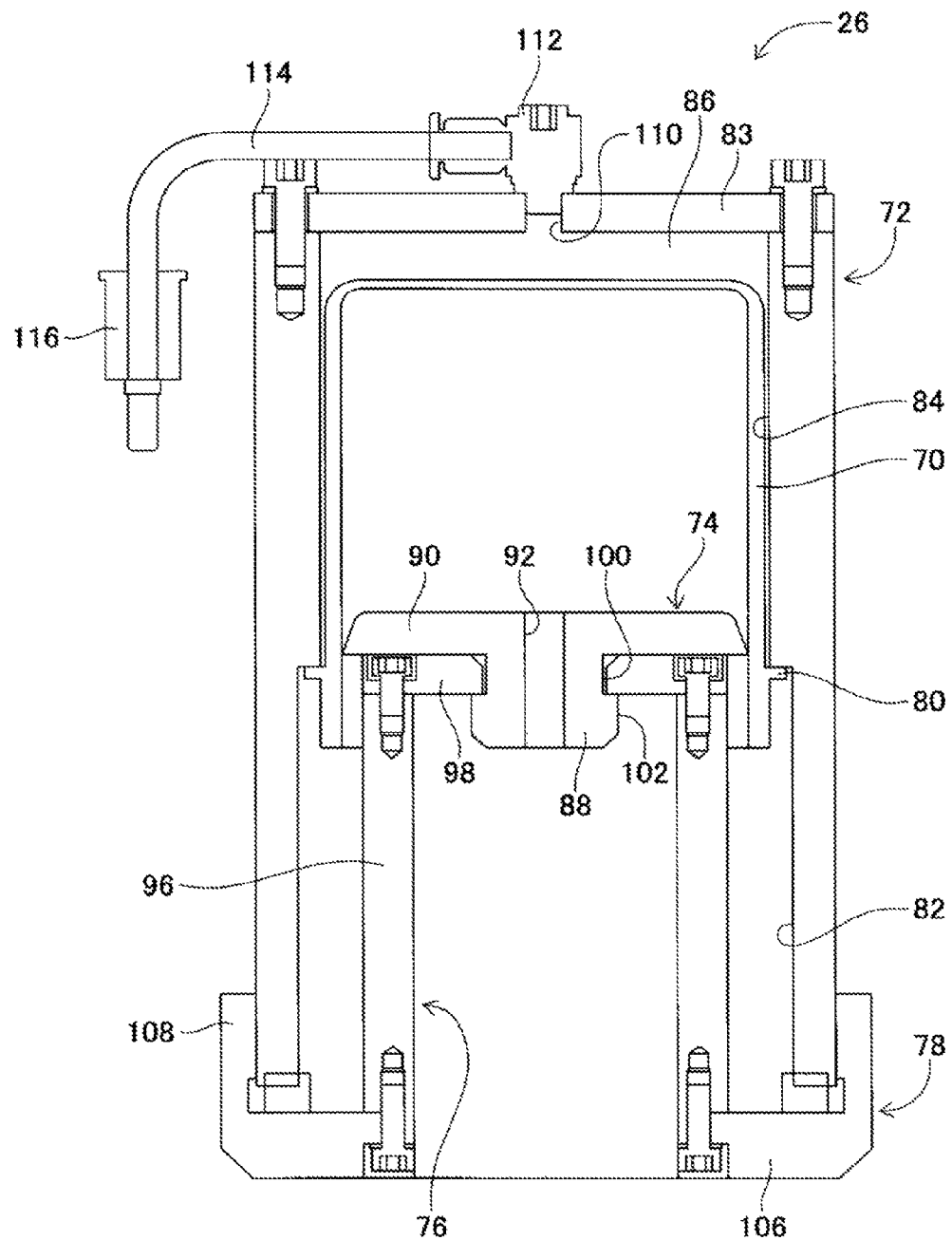
FIG. 2 is a cross-section view showing a solder supply device provided in the solder printer of FIG. 1.

Solder supply device 26 is attached to X-axis slider 60 and is moved to any position above base 54 by moving device 22. As shown in FIG. 2, solder supply device 26 has solder cup 70, outer tube 72, supply nozzle 74, inner tube 76, and fixed lid 78. Solder cup 70 is a bottomed cylindrical container with an opening at one end; solder cup 70 is filled with solder paste. Flange section 80 is formed on the outer circumferential surface at the opening side of solder cup 70; a screw thread (not shown) is formed between flange 80 and the edge of the opening side. Solder cup 70 is sold commercially with a lid (not shown) that engages with the screw thread covering the opening. That is, solder paste manufacturers sell solder cups 70 after filling solder cups 70 with solder paste and covering the opening with a lid. Users purchase solder cups 70 and use them with the lid removed.

Also, outer tube 72 is a bottomed cylinder with an opening at one end; solder cup 70 is stored inside outer tube 72. In detail, the inner circumferential surface of outer tube 72 is configured from first inner circumferential surface 82 that is positioned at the opening side of outer tube 72, and second inner circumferential surface 84 that is positioned at bottom surface 83 of outer tube 72. The inside diameter of first inner circumferential surface 82 is slightly larger than the outer diameter of flange section 80 of solder cup 70; the inside diameter of second inner circumferential surface 84 is slightly larger than the outer diameter of the tubular section of solder cup 70. Further, the end of the bottom side of solder cup 70 is engaged from the opening of outer tube 72 such that solder cup 70 is stored in outer tube 72. By this, solder cup 70 is slidable inside outer tube 72. However, the depth dimension of a portion of second inner circumferential surface 84 of outer tube 72 is longer than the length dimension from flange section 80 of solder cup 70 to the bottom surface, and flange section 80 of solder cup 70 stored in outer tube 72 contacts the step surface between first inner circumferential surface 82 and second inner circumferential surface 84 of outer tube 72. Therefore, space 86 is formed between the bottom surface of solder cup 70 and bottom surface 83 of outer tube 72. Note that, herein, the bottom surface refers to the surface on the opposite side to the opening of a bottomed cylindrical member. In other words, even if the surface on the opposite side to the opening of a bottomed cylindrical member is positioned towards the top, and the opening is positioned towards the bottom, the surface on the opposite side to the opening is given as the bottom surface, not the lid.

Also, supply nozzle 74 is configured from nozzle section 88 and flange section 90; nozzle section 88 and flange section 90 are formed as one body from material that is elastically deformable. Nozzle section 88 is substantially cylindrical with nozzle hole 92 formed running through the inside. Flange section 90 extends in a disk shape from the outer circumferential surface of an end of the nozzle section; the outer diameter of flange section 90 is slightly larger than the inside diameter of solder cup 70. Also, flange section 90 is engaged inside solder cup 70 such that nozzle section 88 faces the opening side of solder cup 70; supply nozzle 74 slides inside solder cup 70 with the outer circumferential section of flange section 90 elastically deformed.

Further, inner tube 76 has cylindrical tube section 96, and ring section 98 that covers the edge of tube section 96; supply nozzle 74 is held by ring section 98. In detail, the outer circumferential surface of nozzle section 88 of supply nozzle 74 is configured from first outer surface 100 positioned on the flange section 90 side and second outer circumferential surface 102 positioned at the tip side of nozzle section 88; the outer diameter of first outer diameter surface 100 is smaller than the outer diameter of second outer circumferential surface 102. On the other hand, the inside diameter of ring section 98 of inner tube 76 is slightly larger than the outer diameter of first outer circumferential surface 100 and slightly smaller than the outer diameter of second outer circumferential surface 102. Also, nozzle section 88 engages with the inside diameter section of ring section 98 while a portion of second circumferential surface 102 is elastically deformed, and the inside diameter of ring section 98 and outer circumferential surface 100 of nozzle section 88 engage. By this, inner tube 76 holds supply nozzle 74 using ring section 98. Note that, inner tube 76 holds supply nozzle 74 using ring section 98, therefore inner tube 76 is positioned inside solder cup 70; however, the end of the side not positioned at ring section 98 of tube section 96 extends from the opening of solder cup 70.

Also, by pulling supply nozzle 74 away from inner tube 76, a portion of second outer circumferential 102 of nozzle section 88 is elastically deformed such that supply nozzle 74 can be removed from inner tube 76. However, the force required to elastically deform the portion of second outer circumferential surface 102 of nozzle section 88 when removing supply nozzle 74 from inner tube 76, that is the holding force of supply nozzle 74 by inner tube 76, is larger than the friction that arises between flange section 90 of supply nozzle 74 engaged inside solder cup 70 and the inner circumferential surface of solder cup 70. Thus, when inner tube 76 holding suction nozzle 74 is pulled in a direction away from solder cup 70, supply nozzle 74 is not separated from inner tube 76, and is removed from solder cup 70 together with inner tube 76.

Further, fixed lid 78 has ring section 106, and erected section 108 established around the entire circumference at the outer edge of ring section 106. A screw thread (not shown) is formed on the inner circumferential surface of erected section 108, the screw thread being engaged with the screw thread (not shown) formed at the opening end side of outer tube 72. By this, fixed lid 78 is removably attached to the opening of outer tube 72. Also, the inside diameter of ring section 106 is substantially the same as the inside diameter of tube section 96 of inner tube 76, and the end section that extends from solder cup 70 of tube section 96 is fixed to the inside edge of ring section 106. Thus, by removing fixed lid 78 from outer tube 72, inner tube 76 is also removed from inside outer tube 72. In this case, supply nozzle 74 held by inner tube 76 is also removed from inside outer tube 72. Further, solder cup 70 is also removed from outer tube 72 by the friction arising between flange section 90 of supply nozzle 74 and the inner circumferential surface of solder cup 70. That is, by removing fixed lid 78 from outer tube 72, inner tube 76, supply nozzle 74, and solder cup 70 are removed as one from outer tube 72.

Also, through-hole 110 is formed in bottom surface 83 of outer tube 72, and air adapter 112 is attached in through-hole 110. Air adapter 112 is connected to an end of air tube 114, and the other end of air tube 114 is connected to device-side air coupler 116. By connecting slider-side air coupler (refer to FIG. 3) 118 provided at the arrangement position of solder supply device 26 to device-side air coupler 116, air is supplied to space 86 inside outer tube 72, and solder paste is ejected from nozzle hole 92 of supply nozzle 74.

Figure 3:
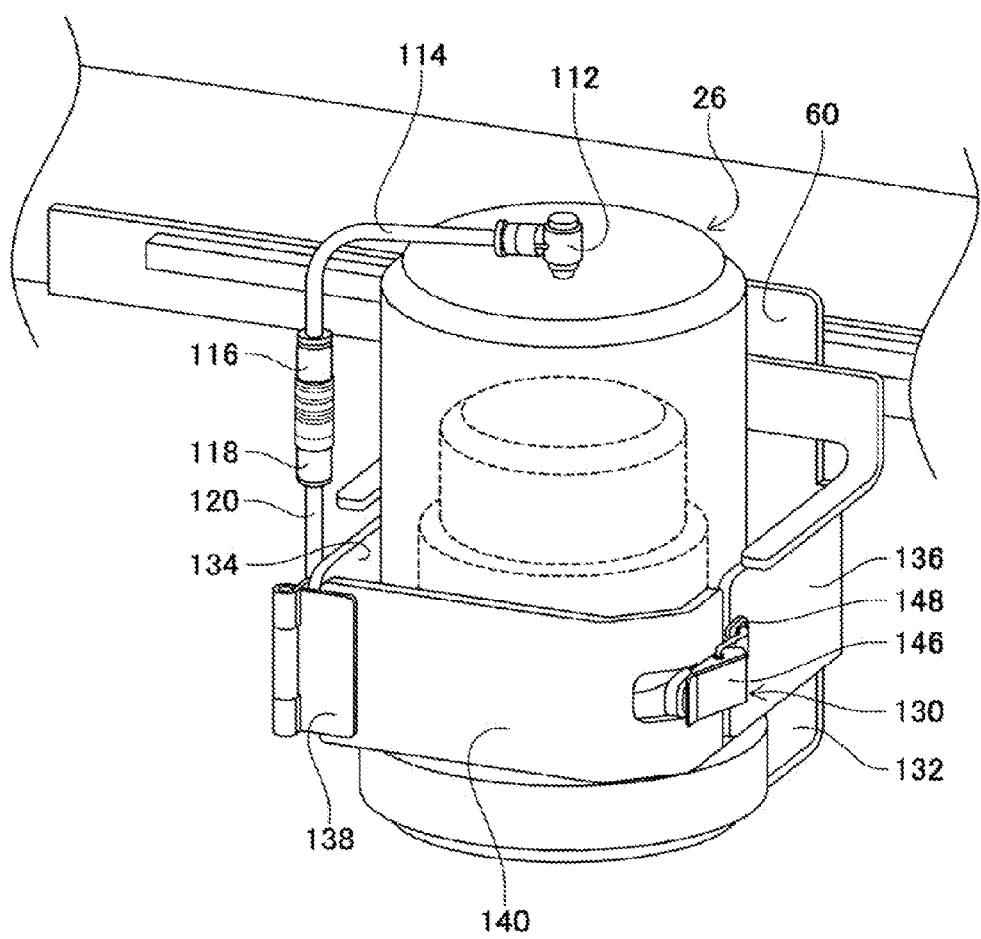
FIG. 3 is a perspective view showing the solder supply device of FIG. 2.

In detail, as shown in FIG. 3, an end of air tube 120 is connected to slider-side air coupler 118, and the other end of air tube 120 is connected to air supply device (refer to FIG. 4) 122. By this, air is supplied from air supply device 122 to space 86 inside outer tube 72. When air is supplied to space 86, the bottom surface of solder cup 70 is pressed towards supply nozzle 74 and solder cup 70 moves down. In this case, the solder paste filling solder cup 70 is compressed and is ejected from nozzle hole 92 of supply nozzle 74. Solder paste ejected from nozzle hole 92 passes through tube section 96 of inner tube 76, and the inner section of ring section 106 of fixed lid 78, and is ejected to the outside of solder supply device 26. Thus, solder supply device 26 supplies solder paste.

In this way, with solder supply device 26, space 86 is demarcated by the bottom surface of solder cup 70 and bottom surface 83 of outer tube 72, with space 86 functioning as an air chamber. That is, by the bottom surface of solder cup 70 being directly pressed by air, solder paste inside solder cup 70 is ejected from nozzle hole 92. Thus, with solder supply device 26, it is not necessary to provide a cylinder device or the like for pushing solder cup 70, and solder supply device 26 can be made more compact. Also, because there is no need to provide a cylinder device or the like, costs are reduced. Further, because there is no need to provide a cylinder device or the like, the configuration of solder supply device 26 can be made simple.

Also, as shown in FIG. 3, solder supply device 26 is detachably mounted on X-axis slider 60 by clip lock 130. In detail, bracket 132 is attached to the lower end of X-axis slider 60, and the lower surface of solder supply device 26 is supported by bracket 132. In other words, solder supply device 26 is able to be loaded on bracket 132. Note that, a through-hole approximately the same as the inner diameter of ring section 106 of fixed lid 78 of solder supply device 26 is formed in bracket 132. By this, solder paste is supplied from solder supply device 26 loaded on bracket 132 via the through-hole in bracket 132.

Two surrounding plates 134 and 136 are fixed on X-axis slider 60 above bracket 132 facing each other and perpendicular to bracket 132. The distance between the two surrounding brackets 134 and 136 is slightly longer than the outer diameter of outer tube 72 of solder supply device 26, and solder supply device 26 is loaded between the two surrounding plates 134 and 136. Also, an end of opening/closing plate 140 is attached to surrounding plate 134 via hinge 138. Lever section 146 of clip lock 130 is provided on the other end of opening/closing plate 140, and hook stopper 148 of clip lock 130 is provided on surrounding plate 136. Also, by performing locking with opening/closing plate 140 in a closed state and lever section 146 latched onto hook stopper 148, solder supply device 26 is fixedly mounted on X-axis slider 60. Also, by releasing the locking of clip lock 130 and opening opening/closing plate 140, solder supply device 26 is able to be removed from X-axis slider 60. Note that, device-side air coupler 116 and slider-side air coupler 118 are detachable, and device-side air coupler 116 is removed from slider-side air coupler 118 when solder supply device 26 is removed from X-axis slider 60.

Figure 4:
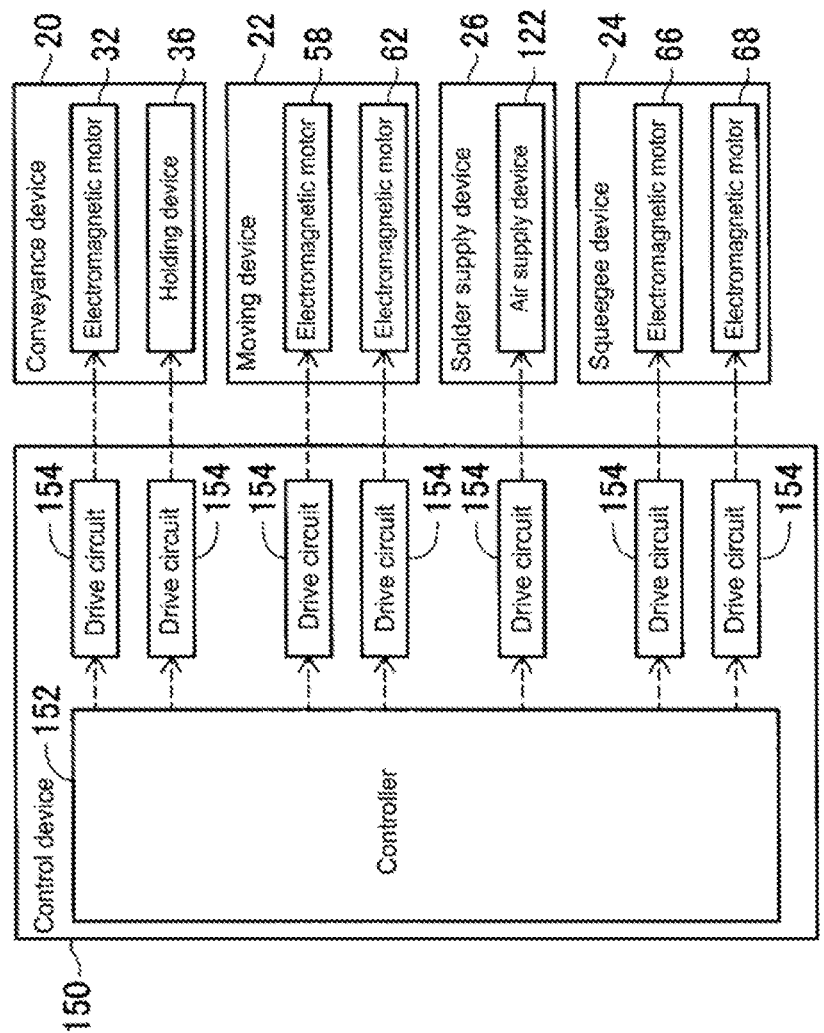
FIG. 4 is a block diagram showing the control device provided in the solder printer of FIG. 1.

Also, as shown in FIG. 4, solder printer 10 is provided with control device 150. Control device 150 is provided with controller 152 and multiple drive circuits 154. Multiple drive circuits 154 are connected to the above-mentioned electromagnetic motors 32, 58, 62, 66, and 68, holding device 36, and air supply device 122. Also, controller 152 is provided with a CPU, ROM, RAM, and the like, forming the main parts of a computer, and is connected to the multiple drive circuits 154. Thus, the operation of conveyance device 20, moving device 22, squeegee device 24, and solder supply device 26 is controlled by controller 152.

<Printing of Solder Paste to Circuit Board>

With solder printer 10, according to the above-described configuration, solder paste is supplied onto the upper surface of a metal mask loaded on circuit board 34 by solder supply device 26, and that solder paste is applied by squeegee device 24. Pattern holes matching the pattern of the pads and so on of circuit board 34 are formed in the metal mask, and solder paste is printed onto circuit board 34 via the pattern holes.

Specifically, based on commands of controller 152, circuit board 34 is conveyed to a work position, and fixedly held at that position by holding device 36. Then, solder supply device 26, based on commands of controller 152, moves to a prescribed position above circuit board 34. Continuing, based on commands of controller 152, solder supply device 26 supplies air from air supply device 122 into space 86 inside outer tube 72. By this, solder paste is ejected from nozzle hole 92, thus supplying solder paste onto the upper surface of the metal mask loaded on circuit board 34. Next, based on commands of controller 152, squeegee device 24 is moved above the location where solder paste was supplied. Then, based on commands of controller 152, squeegee device 24 moves a squeegee down and then moves in the Y-axis direction. By this, solder paste is applied on the upper surface of the metal mask, and solder paste thus enters into the pattern holes. In this manner, solder printer 10 prints solder paste onto circuit board 34.

<Solder Cup Exchange>

When printing solder paste onto circuit board 34 as described above, because solder paste is supplied from solder cup 70 of solder supply device 26, solder cup 70 empties as it moves between a first position to a second position. Thus, a solder cup 70 which has become empty in the second position must be exchanged for a solder cup 70 which is full of solder paste. The exchange procedure for solder cup 70 is described below.

Figure 5:
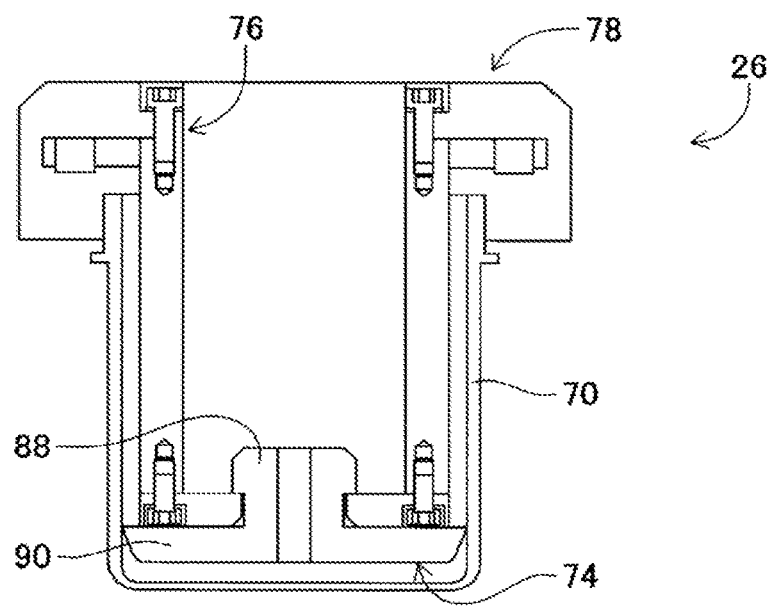
FIG. 5 is a cross-section view showing the solder supply device with the outer tube removed.
Figure 5:
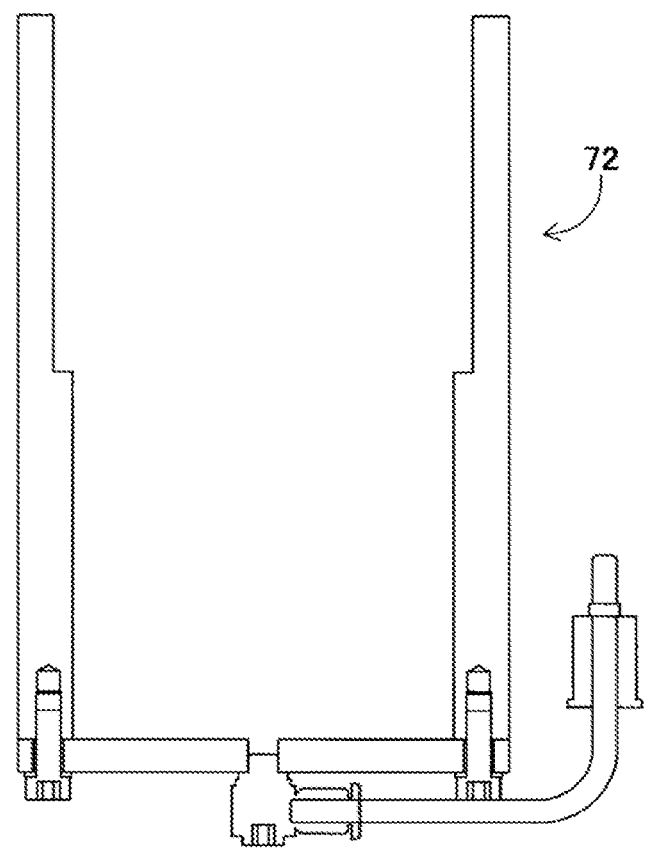

First, the locking of clip lock 130 is released such that opening/closing plate 140 is able to be opened. Also, device-side air coupler 116 is removed from slider-side air coupler 118. Then, solder supply device 26 is removed from X-axis slider 60 and removed from solder printer 10. After solder supply device 26 has been removed from the printer, fixed lid 78 is rotated counterclockwise with respect to outer tube 72 to release the engagement of fixed lid 78 and outer tube 72. By this, as shown in FIG. 5, fixed lid 78, inner tube 76, supply nozzle 74, and solder cup 70 are removed as one single assembly from outer tube 72.

Figure 6:
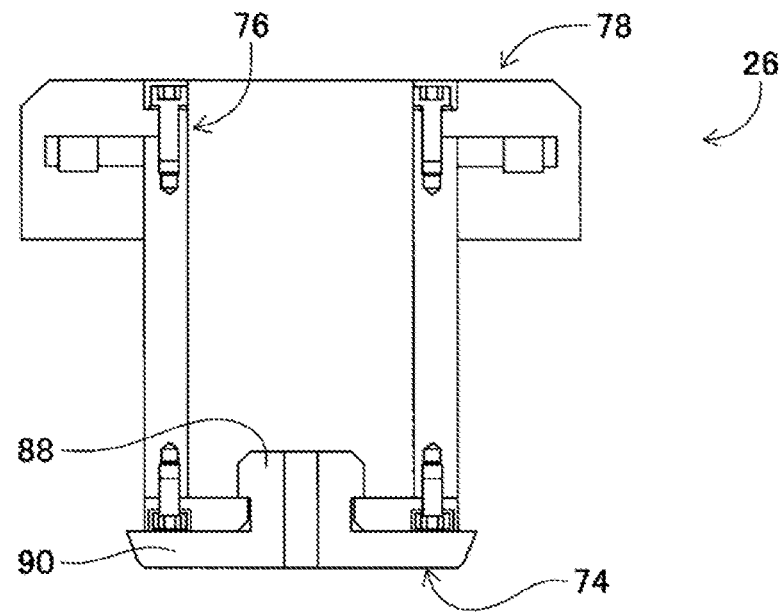
FIG. 6 is a cross-section view showing the solder supply device with the solder cup removed.
Figure 6:
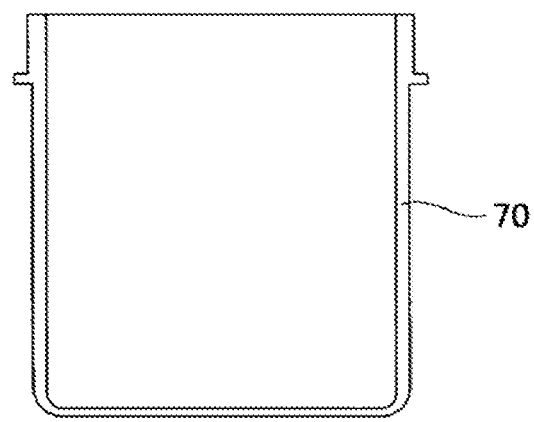

Next, at least one of solder cup 70 and fixed lid 78 is pulled away from the other. By this, as shown in FIG. 6, fixed lid 78, inner tube 76, and supply nozzle 74 are separated as one from solder cup 70. That is, supply nozzle 74 is removed from the inside of empty solder cup 70 along with inner tube 76.

Figure 7:
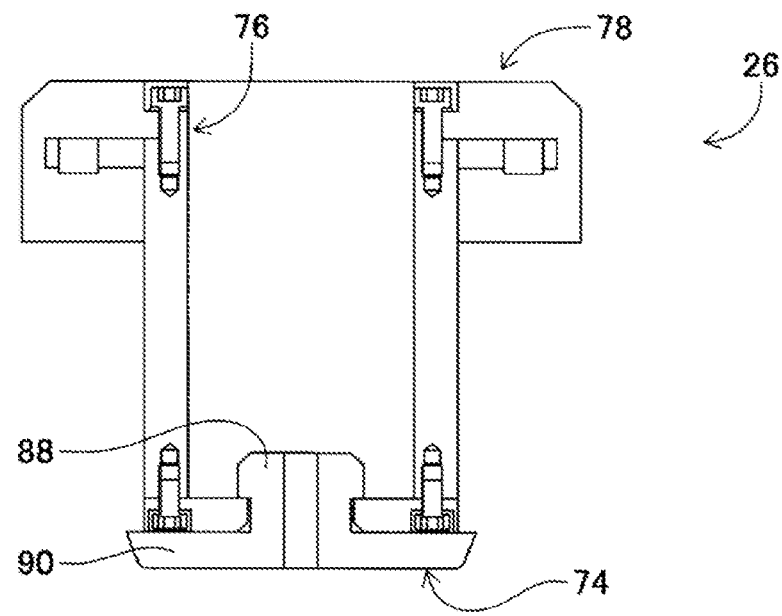
FIG. 7 is a cross-section view showing the solder supply device with a new solder cup housed inside the outer tube.
Figure 7:
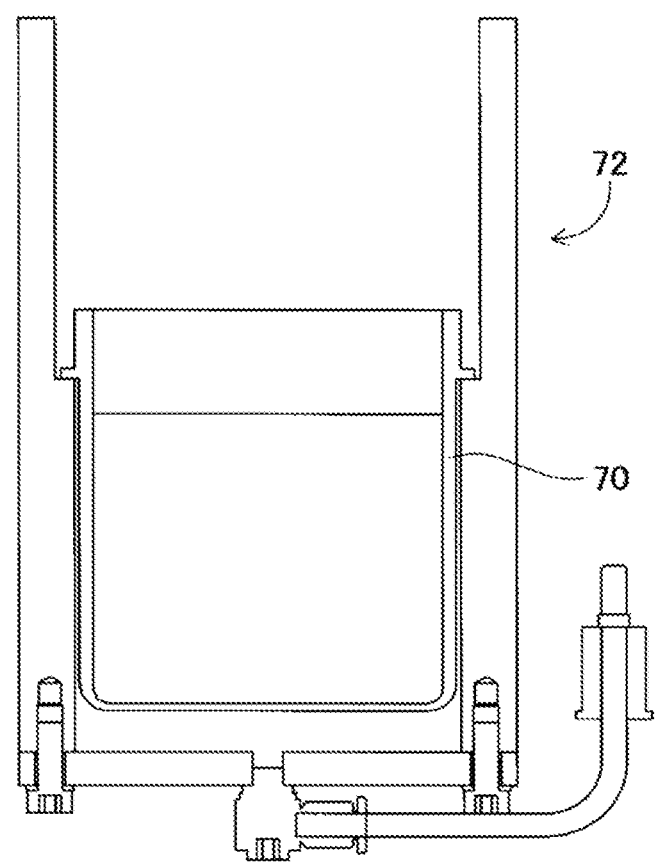
Figure 8:
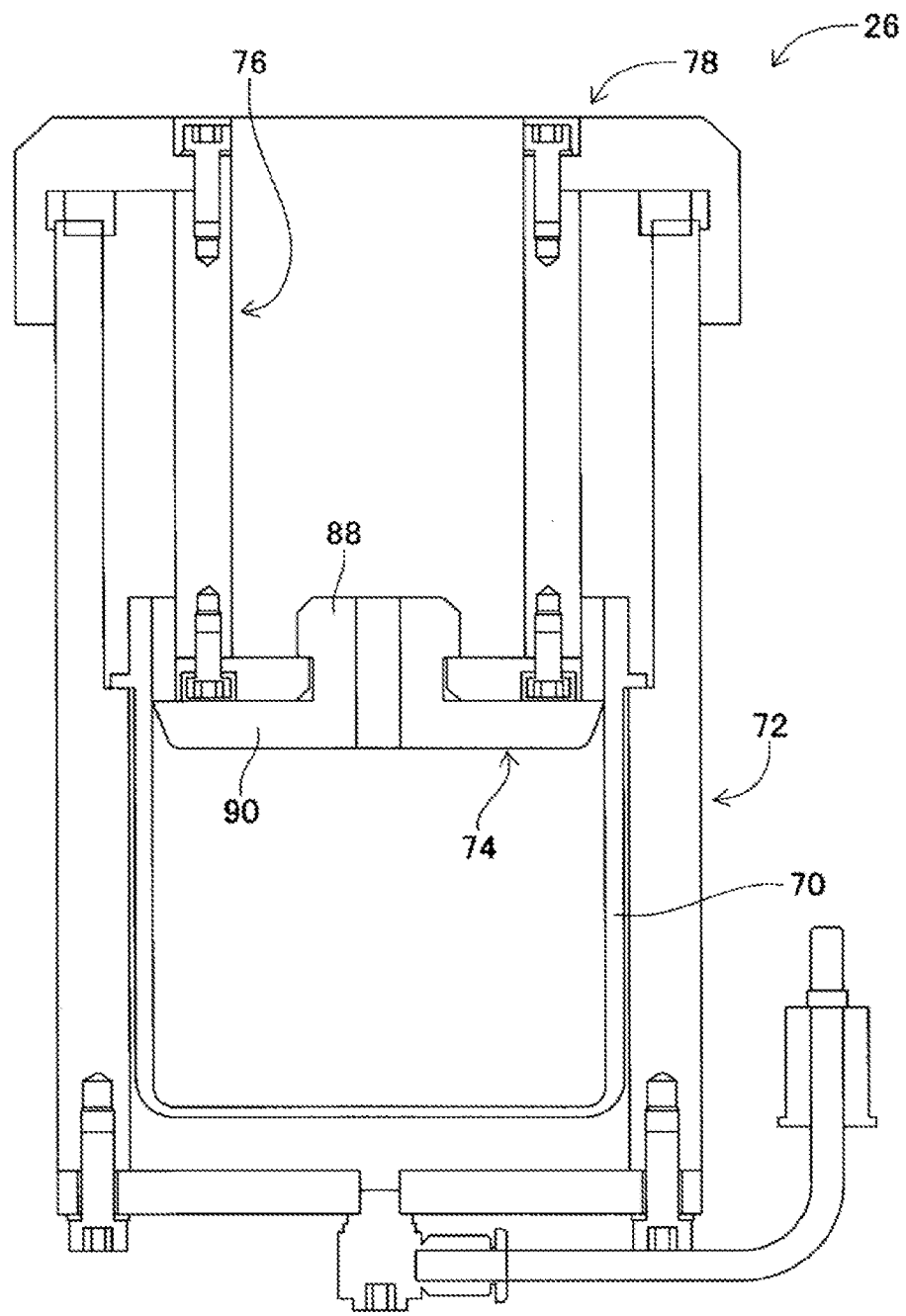
FIG. 8 is a cross-section view of the solder supply device exchanged with a new solder cup.

Continuing, as shown in FIG. 7, a new solder cup 70, that is a solder cup 70 full of solder paste, is set inside outer tube 72. Then, with supply nozzle 74 engaged inside that solder cup 70, fixed lid 78 is engaged with the opening of outer tube 72. By this, as shown in FIG. 8, new solder cup 70 is set inside solder supply device 26.

When new solder cup 70 is set in solder supply device 26, solder supply device 26 is drawn into solder printer 10 and loaded on bracket 132. Then opening/closing plate 140 is closed and clip lock 130 is locked. Also, device-side air coupler 116 is attached to slider-side air coupler 118. By this, solder supply device 26 is fixedly attached to X-axis slider 60, thereby completing exchange of solder cup 70.

In this way, with solder printer 10, by the engaging of fixed lid 78 and outer tube 72, fixed lid 78, outer tube 72, inner tube 76, supply nozzle 74, and solder cup 70 are integrated as one single assembly, thus an operator is able to hold solder supply device 26 with one hand and easily remove it from solder printer 10. By this, it is possible to perform exchange of solder cup 70 outside of solder printer 10, which makes it possible to curtail getting the inside of solder printer 10 dirty due to fallen solder paste and so on during exchange. Also, the exchange work is performed outside solder printer 10, not in the narrow space inside solder printer 10, thus making exchange work easy to perform. Further, cleaning of solder cup 70 and so on can also be performed outside solder printer 10, so cleaning work is also easy. Also, as given above, supply nozzle 74 is able to be removed from inner tube 76, so supply nozzle 74, which is easily dirtied, is able to be cleaned individually.

Also, for example, by preparing another solder supply device 26, it is possible to perform exchange of solder cups in an extremely short time. In detail, a solder supply device different to solder supply device 26 attached to X-axis slider 60 is prepared, and, as shown in FIG. 8, a new solder cup 70 is set in that different solder supply device. Then, exchange of solder cups is completed by removing solder supply device 26 from X-axis slider 60 and attaching the different solder supply device set with the new solder cup 70 to X-axis slider 60. By this, it is possible to perform exchange of solder cups in an extremely short time.

Second Embodiment

Figure 9:
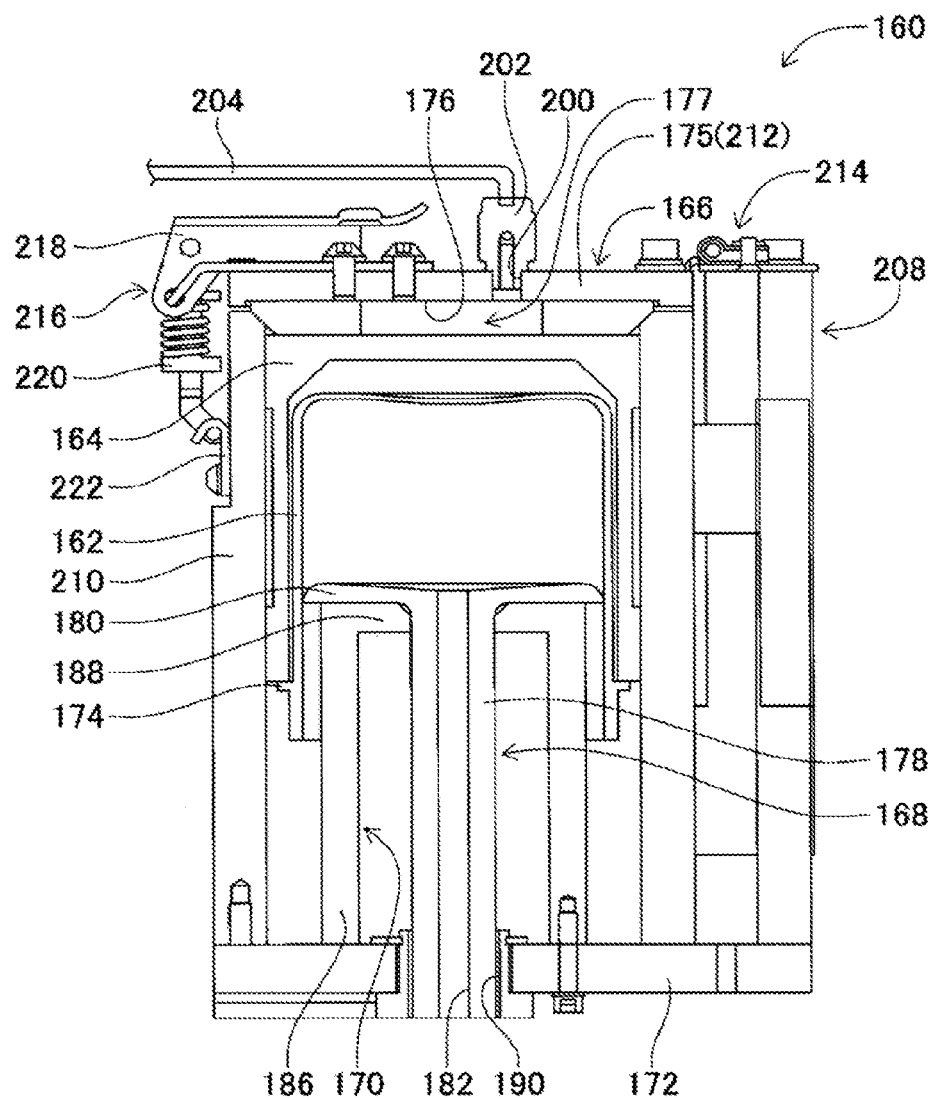
FIG. 9 is a cross-section view showing a second embodiment of a solder supply device.

In solder printer 10 of the first embodiment, solder supply device 26 that is removable from X-axis slider 60 is used, but a solder supply device for which the attaching/removing of a solder cup is easy may be used. As a second embodiment, FIG. 9 shows solder supply device 160 for which the attaching/removing of a solder cup is easy.

Solder supply device 160 has solder cup 162, adapter 164, outer tube 166, supply nozzle 168, inner tube 170, and fixed lid 172. Solder cup 162 has the same form as solder cup 70 of the first embodiment. That is, solder cup 162 is a bottomed cylindrical container with an opening at one end and with flange section 174 formed on the outer circumferential surface at the opening side. Solder cup 162 is filled with solder paste.

Adapter 164 is also a bottomed cylinder with an opening at one end, and solder cup 162 is stored inside adapter 164. In detail, the inside diameter of adapter 164 is slightly smaller than the outer diameter of flange section 174 of solder cup 162, and slightly larger than the outer diameter of the tubular section of solder cup 162. Also, the end of the bottom side of solder cup 162 is engaged from the opening of adapter 164 such that solder cup 162 is stored in adapter 164. Note that, the depth dimension of adapter 164 is longer than the length dimension from flange section 174 of solder cup 162 to the bottom, and flange section 174 of solder cup 162 stored in adapter 164 contacts the opening end of adapter 164. Thus, the section of solder cup 162 further to the side of the opening than flange section 174 extends from the opening of adapter 164.

Also, outer tube 166 is a bottomed cylinder with an opening at one end; adapter 164 is stored inside outer tube 166. In detail, the inside diameter of outer tube 166 is slightly larger than the outer diameter of adapter 164. Further, the bottom surface of adapter 164 and bottom surface 175 of outer tube 166 are facing each other and engaged such that adapter 164 is stored in outer tube 166. By this, adapter 164 is slidable inside outer tube 166. Note that, recess 176 is formed in a center section on the inside of bottom surface 175 of outer tube 166; space 177 is demarcated by recess 176 and the bottom surface of adapter 164.

Figure 10:
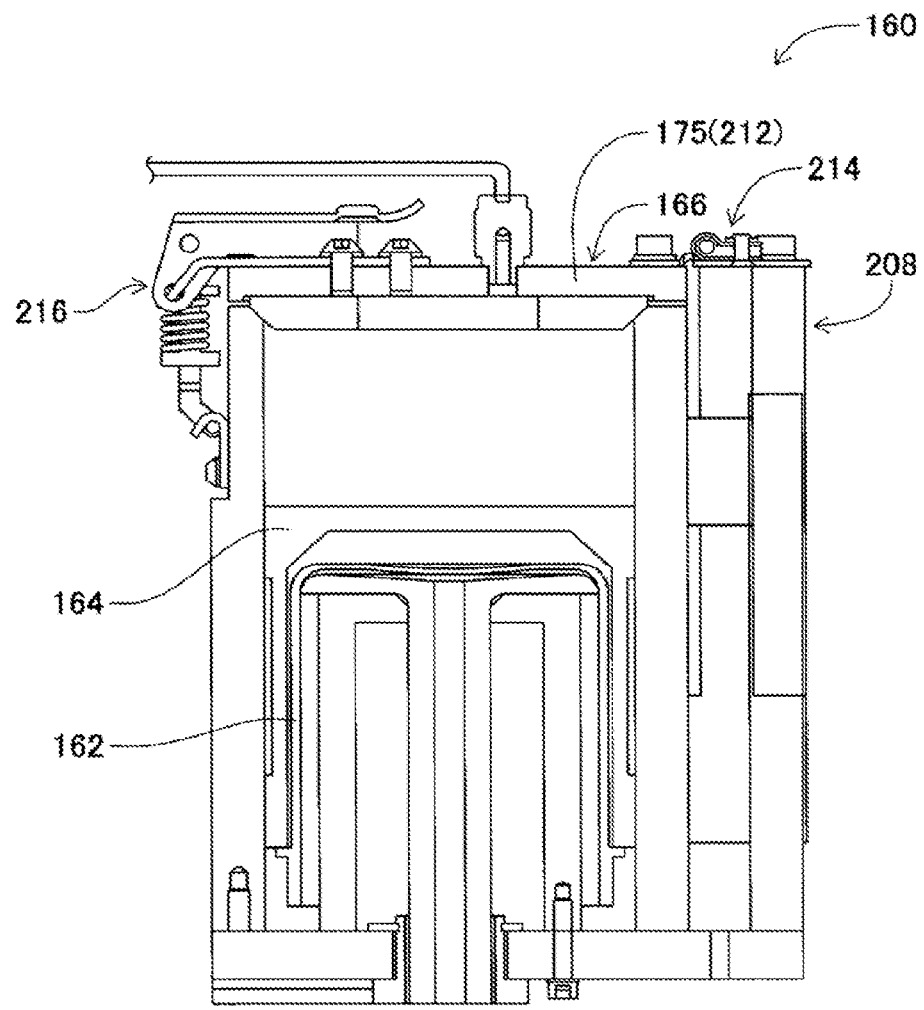
FIG. 10 is a cross-section view showing the solder supply device of FIG. 9 when the cup is empty.

Also, supply nozzle 168 is configured from nozzle section 178 and flange section 180; nozzle section 178 and flange section 180 are formed as one body from material that is elastically deformable. Nozzle section 178 is substantially cylindrical with nozzle hole 182 formed running through the inside. Flange section 180 extends in a disk shape from the outer circumferential surface of an end of nozzle section 178; the outer diameter of flange section 180 is slightly larger than the inside diameter of solder cup 162. Also, flange section 180 is engaged inside solder cup 162 such that nozzle section 178 faces the opening side of solder cup 162; supply nozzle 168 slides inside solder cup 162 with the outer circumferential section of flange section 180 elastically deformed. Note that, the length dimension of nozzle section 178 is longer than the depth dimension of solder cup 162. Thus, supply nozzle 168 and solder cup 162 move relative to each other, and, as shown in FIG. 10, even when flange section 180 is close to the bottom surface of solder cup 162, the tip of nozzle section 178 extends from the opening of solder cup 162.

Also, as shown in FIG. 9, inner tube 170 has cylindrical tube section 186 and ring section 188 that covers the edge of tube section 186. The inside diameter of ring section 188 is slightly larger than the outer diameter of nozzle section 178 of supply nozzle 168. Further, nozzle section 178 is inserted in the inside diameter section of ring section 188, and inner tube 170 supports supply nozzle 168 with flange section 180 of supply nozzle 168 contacting ring section 188.

Also, the length dimension of nozzle section 178 is longer than the length of inner tube 170. By this, nozzle section 178 passes through the inside of inner tube 170, and the tip of nozzle section 178 extends from the end of inner tube 170 opposite to ring section 188.

Also, fixed lid 172 is disk-shaped, with through-hole 190 formed in a center section. Fixed lid 172 is fixed to the opening end of outer tube 166, and covers the opening of outer tube 166. Also, inside of outer tube 166, inner tube 170 is fixed to fixed lid 172 at the end opposite to ring section 188, and the tip of nozzle section 178 of supply nozzle 168 supported by inner tube 170 is inserted inside through-hole 190. Note that, the inside diameter of through-hole 190 is larger than the outer diameter of nozzle section 178.

Also, through-hole 200 is formed in recess 176 of bottom surface 175 of outer tube 166, and air adapter 202 is attached in through-hole 200. Air adapter 202 is connected to an end of air tube 204, and the other end of air tube 204 is connected to air supply device (refer to FIG. 4) 122. According to this kind of configuration, with solder supply device 160, by supplying air from air supply device 122 to the inside of outer tube 166, solder paste is ejected from nozzle hole 182 of supply nozzle 168.

In detail, air is supplied from air supply device 122, via air tube 204 and air adapter 202, to space 177 inside outer tube 166. When air is supplied to space 177, the bottom surface of adapter 164 is pressed towards supply nozzle 168 and adapter 164 moves down. In this case, solder cup 162 also moves down with adapter 164 such that the solder paste in solder cup 162 is compressed. By this, solder paste is ejected from nozzle hole 182 of supply nozzle 168.

In this way, with solder supply device 160, space 177 is divided by the bottom surface of adapter 164 that houses solder cup 162 and recess 176 of outer tube 166, with space 177 functioning as an air chamber. That is, by the bottom surface of adapter that houses solder cup 162 being directly pressed by air, solder paste inside solder cup 162 is ejected from nozzle hole 182. Thus, with solder supply device 160 as well, in a similar manner to solder supply device 26 of the first embodiment, it is not necessary to provide a cylinder device or the like for pushing solder cup 162, and the same effects as solder supply device 26 of the first embodiment are achieved.

Also, with solder supply device 160, bottom surface 175 of outer tube 166 is capable of opening/closing, such that outer tube 166 is capable of swinging. Thus, solder cup 162 can be easily removed/inserted from/into bottom surface 175. In detail, outer tube 166 is held by holding unit 208; holding unit 208 is detachably mounted on X-axis slider 60. Also, outer tube 166 is configured from two members— cylindrical member 210 and bottom member 212—and bottom member 212 is attached to the top end of holding unit 208 via hinge 214. By this, bottom member 212 opens/closes, such that the top side of cylindrical member 210 is opened or closed. Also, lever section 218 and joint 220 of clipping lock 216 are formed on bottom member 212, and hook stopper 222 of clip lock 216 is provided on the upper end of cylindrical member 210. Further, with bottom member 212 closed, joint 220 hooks onto hook stopper 222, and clip lock 216 is locked by the operation of lever section 218. By this, bottom member 212 adheres to the upper end of cylindrical member 210 and space 177 is sealed closed. Also, by releasing the lock of clip lock 216 by the operation of lever section 218, bottom member 212 is opened, and the upper end of cylindrical member 210 is opened too.

Figure 11:
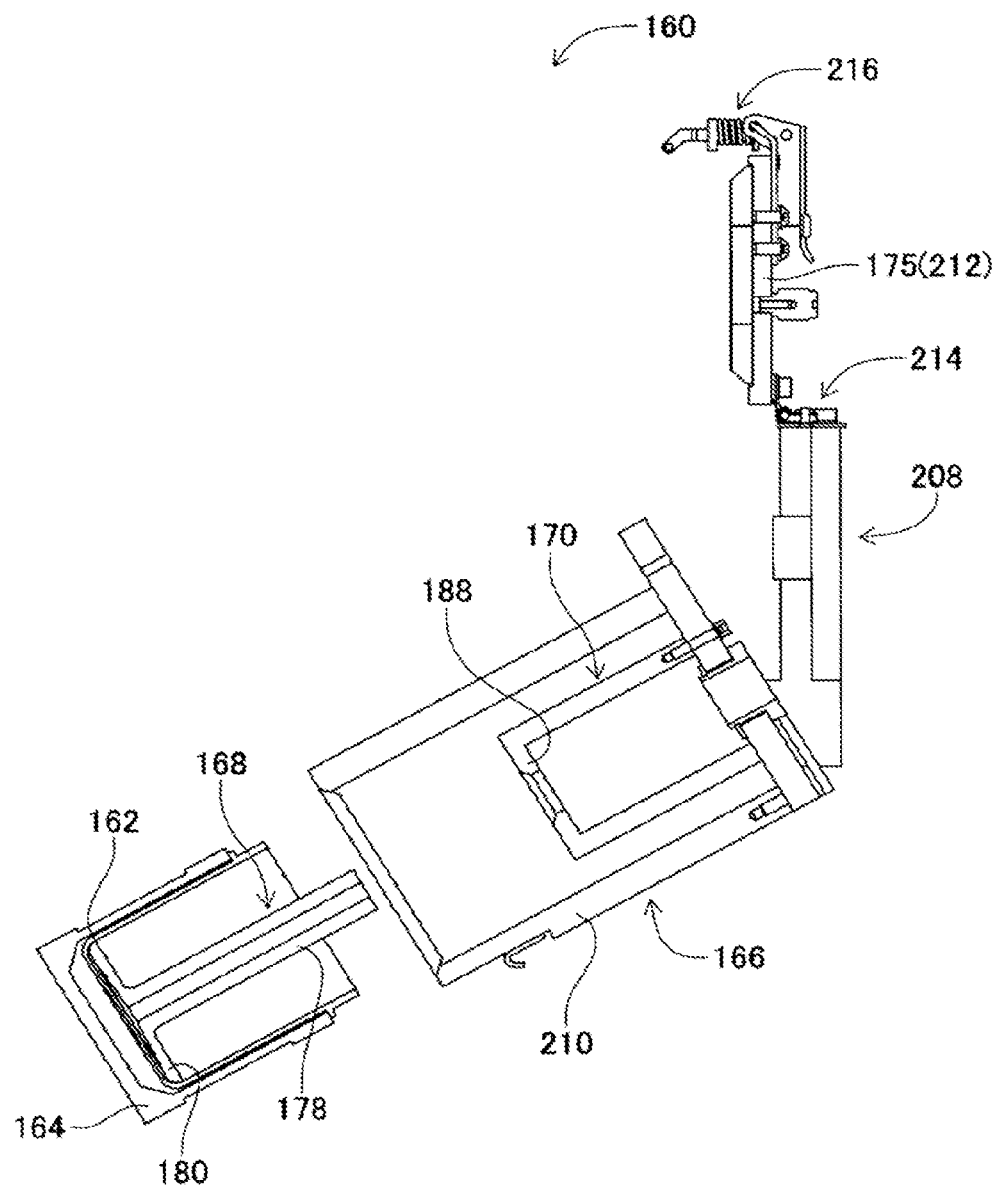
FIG. 11 is a cross-section view showing the solder supply device of FIG. 10 in a swung state.

Also, outer tube 166 is swingably held by holding unit 208. Thus, for example, when the solder paste in solder cup 162 has run out (refer to FIG. 10), by the lock of clip lock 216 being released and bottom member 212 being able to be opened, outer tube 166 swings, as shown in FIG. 11. By this, outer tube 166 is titled 90 degrees or more, and the upper end of outer tube 166 faces down. Due to this, adapter 164 housed inside outer tube 166 is ejected from the upper end of outer tube 166 by gravity. In this case, solder cup 162 housed inside adapter 164 is also ejected from the upper end of outer tube 166 along with adapter 164 due to gravity.

Also, supply nozzle 16 housed inside solder cup 162 is ejected together with solder cup 162 from the upper end of outer tube 166 by the friction arising between flange section 180 of supply nozzle 168 and the inner circumferential surface of solder cup 162. In detail, flange section 180, as described above, is elastically deformed inside solder cup 162, friction arises between flange section 180 and the inner circumferential surface of solder cup 162. Conversely, virtually no friction arises between nozzle section 178 of supply nozzle 168 and ring section 188 of inner tube 170 holding nozzle section 178. This is because the inside diameter of ring section 188 is slightly larger than the outer diameter of nozzle section 178. Thus, the friction arising between flange section 180 and the inner circumferential surface of solder cup 162 is bigger than the friction arising between nozzle section 178 and ring section 188, in other words, the holding force of nozzle section 178 by ring section 188. By this, supply nozzle 168 is ejected together with solder cup 162 from the upper end of outer tube 166.

In this way, with solder supply device 160, the upper end of outer tube 166 is open, so just by swinging outer tube 166, adapter 164, solder cup 162, and supply nozzle 168 can be removed from outer tube 166 as one body. By this, exchange of solder cups can be performed outside of solder printer 10, and the same effects as solder supply device 26 of the first embodiment are achieved.

Also, with exchange of solder cups of the second embodiment, the integrated body of adapter 164, solder cup 162, and supply nozzle 168, is divided into adapter 164, solder cup 162, and supply nozzle 168. Further, a new solder cup is engaged with the divided adapter 164, and supply nozzle 168 is engaged with that new solder cup. By this, adapter 164, the new solder cup, and supply nozzle 168 form an integrated body. Further, the integrated body is housed inside outer tube 166, and by clip lock 216 being locked with the upper end of outer tube 166 being closed by bottom member 212, exchange of solder cups is completed. In this way, with solder supply device 160 of the second embodiment, compared to solder supply device 26 of the first embodiment, the steps for exchanging solder cups are fewer, and solder cup exchange can be performed in a shorter time.

Further, with solder supply device 160, by preparing another adapter 164 and supply nozzle 168, it is possible to perform exchange of solder cups in an extremely short time. In detail, an adapter and supply nozzle different to adapter 164 and supply nozzle 168 housed inside outer tube 166 are prepared. A new solder cup is engaged with that prepared adapter, and the prepared supply nozzle 168 is engaged with the new solder cup. By this, an integrated body of a different adapter, new solder cup, and supply nozzle are formed different to the integrated body of adapter 164, solder cup 162, and supply nozzle 168 housed inside outer tube 166. Further, after the integrated body of adapter 164, solder cup 162, and supply nozzle 168 housed inside outer tube 166 is removed from outer tube 166, solder cup exchange is completed by the integrated body of the different adapter, new solder cup, and supply nozzle being housed inside outer tube 166. By this, it is possible to perform exchange of solder cups in an extremely short time.

Note that, with solder supply device 26 of the first embodiment, it is necessary to prepare a solder supply device different to solder supply device 26 in order to shorten the exchange time of solder cups; however, with solder supply device 160 of the second embodiment, it is only necessary to prepare an adapter and supply nozzle different to adapter 164 and supply nozzle 168. Thus, with solder supply device 160 of the second embodiment, it is possible to shorten the exchange time for solder cups with a relatively low-cost investment.

Figure 12:
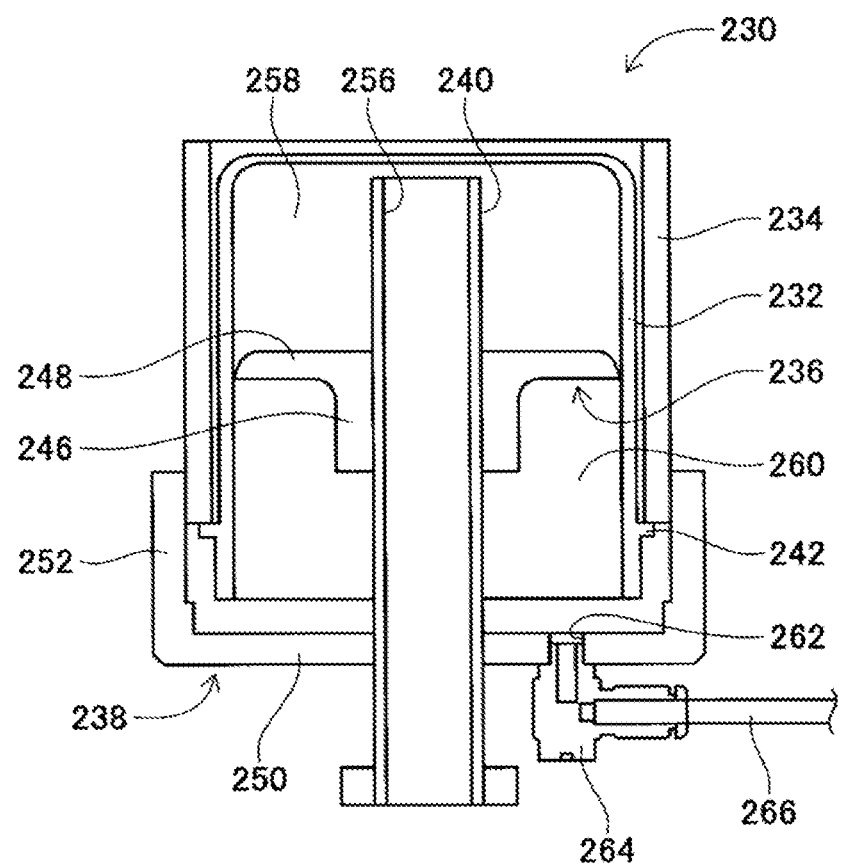
FIG. 12 is a cross-section view showing a third embodiment of a solder supply device.

Third embodiment With solder supply devices 26 and 160 of the first embodiment and the second embodiment, solder paste was ejected by the moving of solder cups 170 and 162; however, solder paste may be ejected by the moving of a supply nozzle. As a third embodiment, FIG. 12 shows solder supply device 230 that ejects solder paste by the moving of a supply nozzle.

Solder supply device 230 has solder cup 232, outer tube 234, piston 236, fixed lid 238, and nozzle pipe 240. Solder cup 232 has the same form as solder cup 70 of the first embodiment. That is, solder cup 232 is a bottomed cylindrical container with an opening at one end and with flange section 242 formed on the outer circumferential surface at the opening side. Further, solder cup 232 is filled with solder paste.

Outer tube 234 is a cylinder of which both ends are open; solder cup 232 is stored inside outer tube 234. In detail, the inside diameter of outer tube 234 is slightly smaller than the outer diameter of flange section 242 of solder cup 232, and slightly larger than the outer diameter of the tubular section of solder cup 232. Further, the end of the bottom side of solder cup 232 is engaged from the end of outer tube 234 such that solder cup 232 is stored in outer tube 234. Note that, the section of solder cup 232 further to the side of the opening than flange section 242 extends from the opening of outer tube 234.

Also, piston 236 is configured from cylindrical section 246 and flange section 248; cylindrical section 246 and flange section 248 are formed as one body from material that is elastically deformable. Flange section 248 extends in a disk shape from the outer circumferential surface of an end of cylindrical section 246; the outer diameter of flange section 248 is slightly larger than the inside diameter of solder cup 232. Also, flange section 248 is engaged inside solder cup 232 such that cylindrical section 246 faces the opening side of solder cup 232, and slides inside solder cup 232 while elastically deformed.

Further, fixed lid 238 has ring section 250, and erected section 252 established around the entire circumference at the outer edge of ring section 250. A screw thread (not shown) is formed on the inner circumferential surface of erected section 252, the screw thread being engaged with the screw thread (not shown) formed at the outer circumferential surface of an end of outer tube 234. By this, fixed lid 238 is removably attached to the end of outer tube 234.

Also, nozzle pipe 240 is substantially cylindrical with nozzle hole 256 formed running through the inside. The outer diameter of nozzle pipe 240 is approximately the same as the inside diameter of ring section 250 of fixed lid 238, and nozzle pipe 240 is inserted into ring section such that nozzle pipe 240 and ring section 250 are fixed together. Thus, the end of nozzle pipe 240 fixed to ring section 250 extends from fixed lid 238, and the other end is inserted into outer tube 234, in other words, is inserted into solder cup 232 housed in outer tube 234. Nozzle pipe 240 inserted into solder cup 232 is engaged inside cylindrical section 246 of piston 236 housed inside solder cup 232. The inside diameter of cylindrical section 246 is slightly smaller than the outer diameter of nozzle pipe 240. Thus, cylindrical section 246 slides across the outer circumferential surface of nozzle pipe 240 in an elastically deformed state.

According to the above configuration, by an end of outer tube 234 being closed by fixed lid 238, the inside of solder cup 232 is demarcated into upper chamber 258 and lower chamber 260 by piston 236. Upper chamber 258 of solder cup 232 is filled with solder paste. On the other hand, nothing is filled in lower chamber 260, but through-hole 262 is formed in fixed lid 238, and through-hole 262 is formed in lower chamber 260. Air adapter 264 is attached to the through-hole 262. Air adapter 264 is connected to an end of air tube 266, and the other end of air tube 266 is connected to air supply device (refer to FIG. 4) 122. According to this kind of configuration, with solder supply device 230, by supplying air from air supply device 122, solder paste is ejected from nozzle hole 256 of nozzle pipe 240.

In detail, air is supplied from air supply device 122, via air tube 266 and air adapter 264, to lower chamber 260. When air is supplied to lower chamber 260, the lower chamber 260 side surface of piston 236, that is the surface of piston 236 facing the opening of solder cup 232, is pressed towards the bottom surface of solder cup 232, and piston 236 moves up. Thus, the solder paste inside upper chamber 258 is compressed and is ejected from nozzle hole 256 at the tip of nozzle pipe 240 that extends from fixed lid 238.

In this way, with solder supply device 230, by an end of outer tube 234 being closed by fixed lid 238, the inside of solder cup 232 is demarcated into upper chamber 258 and lower chamber 260 by piston 236. Further, upper chamber 258 is filled with solder paste, with lower chamber 260 functioning as an air chamber. That is, by the lower chamber side surface of piston 236 being directly pressed by air, solder paste inside upper chamber 258 is ejected from nozzle hole 256. Thus, with solder supply device 230 of the third embodiment as well, in a similar manner to solder supply device 26 of the first embodiment and solder supply device 160 of the second embodiment, it is not necessary to provide a cylinder device or the like, and the same effects as solder supply device 26 and solder supply device 160 are achieved.

Also, with solder cup exchange of the third embodiment, fixed lid 238 is rotated counterclockwise with respect to outer tube 234, so as to release the engagement of fixed lid 238 and outer tube 234. By this, fixed lid 238 and nozzle pipe 240 are removed from outer tube 234. Here, piston 236 engaged with nozzle pipe 240 is also removed from outer tube 234 together with nozzle pipe 240 by the friction arising between nozzle pipe 240 and ring section 246 of piston 236. Further, solder cup 232 engaged with piston 236 is also removed from outer tube 234 together with piston 236 by the friction arising between flange section 248 of piston 236 and solder cup 232. By this, fixed lid 238, nozzle pipe 240, piston 236, and solder cup 232 are removed as one from outer tube 234.

Next, by pulling at least one of fixed lid 238 and solder cup 232 in a direction away from the other, solder cup 232 only is separated from the integrated body of fixed lid 238, nozzle pipe 240, piston 236, and solder cup 232. This is due to the friction arising between nozzle pipe 240 and cylindrical section 246 of piston 236. In detail, cylindrical section 246 of piston 236, as described above, is elastically deformed at the outer circumferential surface of nozzle pipe 240, and friction arises between cylindrical section 246 and nozzle pipe 240. Also, flange section 248 of piston 236, as described above, is elastically deformed at the inside circumferential surface of solder cup 232, and friction arises between flange section 248 and solder cup 232; however, that friction is smaller than the friction that arises between cylindrical section 246 and nozzle pipe 240. Thus, piston 236 is removed from solder cup 232 together with nozzle pipe 240.

In this way, empty solder cup 232 is separated by piston 236 being removed from solder cup 232. Next, a new solder cup is engaged with the separated outer tube 234. Solder cup exchange is completed by the integrated body of fixed lid 238, nozzle pipe 240, and piston 236 being attached to outer tube 234 that is engaged with the new solder cup. In this way, with solder supply device 230 of the third embodiment as well, solder cup exchange can be performed with relatively few steps, which means solder cup exchange work can be performed in a short time.

Also, solder supply device 230 of the third embodiment may be attached to X-axis slider 60 instead of solder supply device 26 of the first embodiment. By this, removing solder supply device 230 from solder printer 10 is easy, and the same effects as solder supply device 26 are achieved.

Note that, in the above embodiments, solder printer 10 is an example of a solder printer. Solder supply device 26 is an example of a solder supply device. Solder cup 70 is an example of a solder container. Outer tube 72 is an example of an outer tube and a demarcating member. Inner tube 76 is an example of an inner tube. Space 86 is an example of an air chamber. Nozzle section 88 is an example of a nozzle. Flange section 90 is an example of a piston. Clip lock 130 is an example of a lock mechanism. Solder supply device 160 is an example of a solder supply device. Solder cup 162 is an example of a solder container. Adapter 164 is an example of an adapter. Outer tube 166 is an example of an outer tube and a demarcating member. Inner tube 170 is an example of an inner tube. Space 177 is an example of an air chamber. Nozzle section 178 is an example of a nozzle. Flange section 180 is an example of a piston. Solder supply device 230 is an example of a solder supply device. Solder cup 232 is an example of a solder container. Piston 236 is an example of a piston. Fixed lid 238 is an example of a lid and a demarcating member. Nozzle pipe 240 is an example of a nozzle. Lower chamber 260 is an example of an air chamber.

Further, the present disclosure is not limited to the above example embodiments, and various changed or improved methods of embodiment are possible based on the knowledge of someone skilled in the art. Specifically, for example, in the first embodiment described above, clip lock 130 is used as a lock mechanism for detachably attaching solder supply device 26 to X-axis slider 60, but various lock mechanisms may be used. However, considering factors such as making exchange time short, it is desirable to use a lock mechanism for which solder supply device 26 is attached/removed to/from X-axis slider 60 with a single touch, that is, it is desirable to use a lock mechanism for which the repeatability of attaching/removing solder supply device 26 is good. Specifically, for example, it is desirable to use a magnetic or spring-type lock mechanism or the like.

Also, with the third embodiment described above, fixed lid 238 is engaged with outer tube 234, but the fixed lid may be engaged with solder cup 232. In this way, when engaging the fixed lid with solder cup 232, outer tube 234 is not required, which reduces costs. Also, when engaging the fixed lid with solder cup 232, it is possible to use the screw thread formed in advance on solder cup 232, that is, the screw thread with which the lid of the solder cup engages. By this, it is not necessary to form a screw thread in the solder cup, which reduces costs.

REFERENCE SIGNS LIST

10: solder printer; 26: solder supply device; 70: solder cup (solder container); 72: outer tube (demarcating member); 76: inner tube; 86: space (air chamber); 88: nozzle section (nozzle); 90: flange section (piston); 130: clip lock (lock mechanism); 160: solder supply device; 162: solder cup (solder container); 164: adapter; 166: outer tube (demarcating member); 170: inner tube; 177: space (air chamber); 178: nozzle section (nozzle); 180: flange section (piston); 230: solder supply device; 232: solder cup (solder container); 236: piston; 238: fixed lid (lid) (demarcating member); 240: nozzle pipe (nozzle); 260: lower chamber (air chamber)

The invention claimed is:

1. A solder supply device comprising:
   a solder container housing liquid solder that is tubular, is open at an opening provided at a first end of the solder container, and includes a bottom at a second end of the solder container;
   an outer tube inside which the solder container is stored;
   a nozzle, for ejecting solder from the solder container, that is inserted into the solder container;
   a piston that is provided on an outer circumferential section of the nozzle and that is engaged inside of the solder container from the opening of the solder container; and
   a demarcating member that demarcates an air chamber with at least one of the following: a surface of the second end of the solder container, an adapter attached to the surface of the second end of the solder container, or a surface of the piston facing the opening of the solder container, wherein the solder supply device supplies solder from a tip of the nozzle by relatively moving the solder container and the piston by supplying air to the air chamber such that the piston advances inside the solder container between a first position and a second position, the piston being closer to the opening of the solder container in the first position than in the second position, and wherein, in the second position of the piston, the solder container and the piston are removable from the outer tube as a single assembly from the outer tube.

2. The solder supply device according to claim 1, wherein
   the piston is provided on the outer circumferential section of the nozzle relatively movable to the nozzle,
   the solder supply device is further provided with a lid that seals the opening of the solder container in a state with the tip of the nozzle inserted into the solder container, and
   the lid functions as the demarcating member.

3. The solder supply device according to claim 1, wherein
   the piston is fixedly provided on the outer circumferential surface of the nozzle,
   the outer tube is tubular with an opening at a first end of the outer tube and that stores the solder container in a state with the second end of the solder container engaged from the opening, and
   the tube functions as the demarcating member.

4. The solder supply device according to claim 3, wherein
   the solder supply device is further provided with an inner tube that is tubular with an opening at first and second ends of the inner tube, holds the piston or the nozzle at the first end of the inner tube, extends from the opening of the solder container at the second end of the inner tube, and is fixed to the outer tube.

5. The solder supply device according to claim 4, wherein
   the inner tube is separable from the piston or the nozzle.

6. The solder supply device according to claim 4, wherein
   a surface of a second end of the outer tube is openable/closable.

7. The solder supply device according to claim 6, wherein
   the outer tube is swingably attached to a solder printer that prints solder on a target object.

8. The solder supply device according to claim 6, wherein
   a friction arising between the piston provided at the outer circumferential section of the nozzle and the inner circumferential surface of the solder container is greater than a holding force of the piston or the nozzle by the inner tube.

9. The solder supply device according to claim 2, wherein
   the solder supply device is detachably mounted on a solder printer that prints solder on a target object by a lock mechanism.

* * * * *